(12) United States Patent
Kim et al.

(10) Patent No.: US 7,863,599 B2
(45) Date of Patent: Jan. 4, 2011

(54) LIGHT EMITTING DIODE

(75) Inventors: Hwa Mok Kim, Ansan-si (KR); Dae Won Kim, Ansan-si (KR); Dae Sung Kal, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 344 days.

(21) Appl. No.: 12/203,762

(22) Filed: Sep. 3, 2008

(65) Prior Publication Data

US 2009/0108250 A1    Apr. 30, 2009

(30) Foreign Application Priority Data

Oct. 29, 2007   (KR) .................. 10-2007-0108686

(51) Int. Cl.
*H01L 29/06* (2006.01)
(52) U.S. Cl. ................. 257/13; 257/E33.068
(58) Field of Classification Search ............ 257/13, 257/E33.068
See application file for complete search history.

(56) References Cited

U.S. PATENT DOCUMENTS

| | | | |
|---|---|---|---|
| 7,109,048 B2 * | 9/2006 | Ha et al. | 438/22 |
| 7,166,483 B2 * | 1/2007 | Liu et al. | 438/29 |
| 7,279,751 B2 * | 10/2007 | Ueda et al. | 257/347 |
| 7,786,502 B2 * | 8/2010 | Sakai | 257/99 |
| 2008/0179605 A1 * | 7/2008 | Takase et al. | 257/94 |

FOREIGN PATENT DOCUMENTS

KR    10-0721515    5/2007

\* cited by examiner

*Primary Examiner*—Trung Dang
(74) *Attorney, Agent, or Firm*—H.C. Park & Associates, PLC

(57) ABSTRACT

A light emitting diode (LED) has an n-type semiconductor layer, an active layer, a p-type semiconductor layer, and a transparent electrode layer. The LED includes a tunnel layer interposed between the p-type semiconductor layer and the transparent electrode layer, an opening arranged in the transparent electrode layer so that the tunnel layer is exposed, a distributed Bragg reflector (DBR) arranged in the opening, and an electrode pad arranged on the transparent electrode layer to cover the DBR in the opening.

10 Claims, 2 Drawing Sheets

LIGHT EMITTING DIODE

CROSS REFERENCE TO RELATED APPLICATION

This application claims priority from and the benefit of Korean Patent Application No. 10-2007-0108686, filed on Oct. 29, 2007, which is incorporated by reference for all purposes as if fully set forth herein.

BACKGROUND OF THE INVENTION

1. Field of the Invention

The present invention relates to a light emitting diode (LED), particularly a GaN-based LED, and more particularly, to an LED having enhanced current spreading and light extraction efficiencies by incorporating a layer between a semiconductor layer and an electrode pad.

2. Discussion of the Background

An LED is a photoelectric conversion device that emits light through recombination of electrons and holes when current is applied. As an example, a GaN-based LED has an n-type semiconductor layer, an active layer, and a p-type semiconductor layer, which are sequentially arranged on a substrate. A transparent electrode layer is arranged on the p-type semiconductor layer, and a p-type electrode pad is arranged on the transparent electrode. The active layer and the p-type semiconductor layer may be partially removed so that a portion of the n-type semiconductor layer is exposed. An n-type electrode pad is arranged on an upper region of the exposed n-type semiconductor layer.

In such an LED, light is mainly emitted through a portion of the transparent electrode layer, which serves as an electrode together with the electrode pad. Therefore, when selecting a material for the transparent electrode layer, it should have strong electrical characteristics and should minimally interrupt light emission. A Ni/Au layer or an indium tin oxide (ITO) layer may be used as the transparent electrode layer. The Ni/Au layer has an excellent electrical characteristic but has a low transparency with respect to visible light. Conversely, the ITO layer has a transmittance of 90% or more with respect to visible light and thus is excellent in transparency, but has a low electrical characteristic.

In a conventional LED, an opening may be formed by etching a portion of a transparent electrode layer (particularly, an ITO layer), and a p-type electrode pad contacts the p-type semiconductor layer through the opening. In the conventional LED, a p-type tunnel layer (p++) doped with a highly concentrated p-type impurity is arranged on the p-type semiconductor layer for establishing an ohmic contact. Therefore, the p-type electrode pad contacts the p-type tunnel layer.

However, in the conventional LED, current flow is concentrated just under the p-type electrode pad, and therefore, current may not be widely spread out on the transparent electrode layer. This is because the p-type electrode pad is in direct contact with the p-type tunnel layer. The structure causes the recombination rate of electrons and holes in an active layer to decrease, thereby lowering luminous efficiency. Also, in the conventional LED, a large amount of light may be absorbed by the p-type electrode pad, and therefore lost.

SUMMARY OF THE INVENTION

This invention provides an LED having a distributed Bragg reflector (DBR) formed under a p-type electrode pad to reduce light absorption and light loss and to spread light to surroundings of the DBR.

Additional features of the invention will be set forth in the description which follows, and in part will be apparent from the description, or may be learned by practice of the invention.

The present invention discloses an LED having an n-type semiconductor layer, an active layer, a p-type semiconductor layer, and a transparent electrode layer. The LED includes a tunnel layer interposed between the p-type semiconductor layer and the transparent electrode layer, an opening arranged in the transparent electrode layer so that the tunnel layer or the p-type semiconductor layer arranged under the tunnel layer is exposed upward, a distributed Bragg reflector (DBR) arranged in the opening; and an electrode pad arranged on the transparent electrode layer to cover the DBR in the opening. The LED may be a GaN-based LED.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
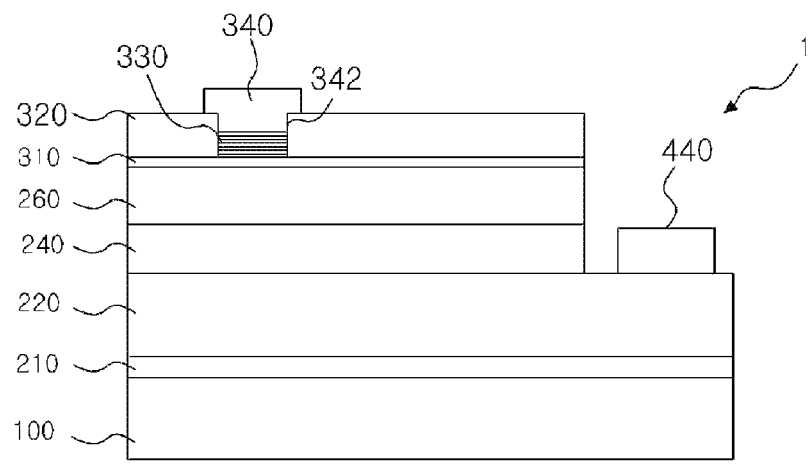
FIG. 1 is a sectional view of an LED according to an embodiment of the present invention.

Hereinafter, embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
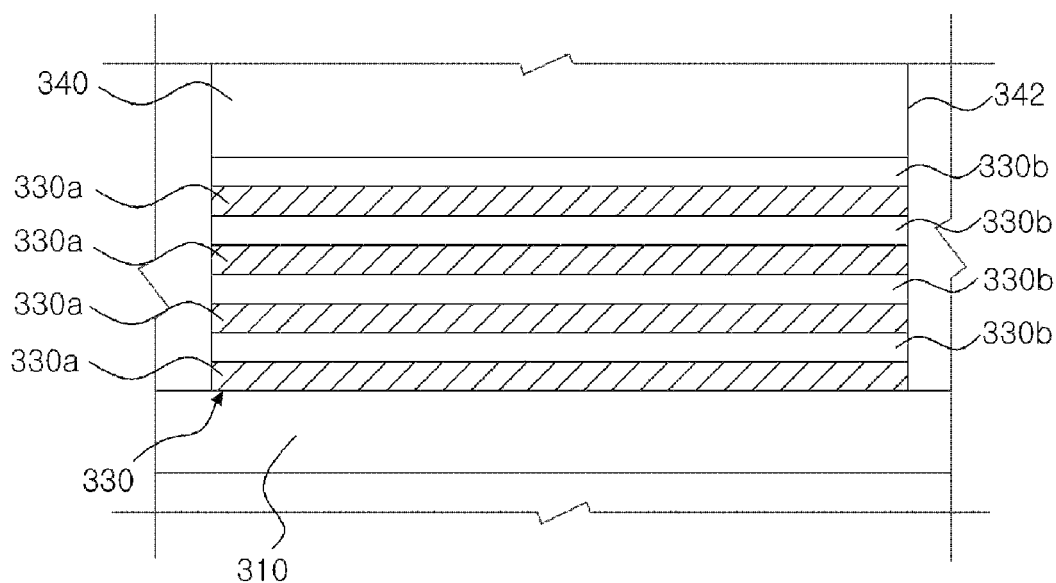
FIG. 2 is a sectional view illustrating a DBR structure of the LED shown in FIG. 1.

FIG. 1 is a sectional view of an LED according to an embodiment of the present invention, and FIG. 2 is a sectional view illustrating a DBR structure of the LED shown in FIG. 1.

Referring to FIG. 1, an LED 1 includes an n-type semiconductor layer 220, an active layer 240, and a p-type semiconductor layer 260, which are all arranged on a substrate 100. The active layer 240 is interposed between the n-type semiconductor layer 220 and the p-type semiconductor layer 260, and a transparent electrode layer 320 is arranged on an upper surface of the p-type semiconductor layer 260. In addition, portions of the active layer 240 and the p-type electrode layer 260 may be removed so that a portion of the n-type semiconductor layer 220 is exposed upward. A p-type electrode pad 340 may be arranged on an upper surface of the transparent electrode layer 320, and an n-type electrode pad 440 may be arranged on an upper surface of the n-type semiconductor layer 220.

The substrate 100 may be a sapphire (Al$_2$O$_3$) substrate or a SiC substrate having a thermal conductivity higher than that of a sapphire substrate. A buffer layer 210 for reducing lattice mismatch between the substrate 100 and the n-type semiconductor layer 220 may be arranged on the substrate 100. The semiconductor layers arranged on the substrate 100 may be formed of a GaN-based semiconductor. The buffer layer 210 may be formed of AlN or GaN.

The active layer 240 is partially arranged on a region of the n-type semiconductor layer 220, and the p-type semiconductor 260 is arranged on the active layer 240. Therefore, a region of the upper surface of the n-type semiconductor layer 220 contacts the active layer 240, and another region of the upper surface of the n-type semiconductor layer 220 is exposed upward by the partial removal of the p-type semiconductor layer 260 and the active layer 240. An indium tin oxide (ITO) transparent electrode layer having excellent transmittance of visible light is used as the transparent electrode layer 320 and arranged on the p-type semiconductor layer 260.

The n-type semiconductor layer 220 may be formed of n-type Al$_x$In$_y$Ga$_{1-x-y}$N ($0 \leq x, y, x+y \leq 1$) and may include an n-type clad layer. The p-type semiconductor layer 260 may be formed of p-type Al$_x$In$_y$Ga$_{1-x-y}$N ($0 \leq x, y, x+y \leq 1$) and may include a p-type clad layer. The n-type semiconductor layer 220 may be doped with Si, and the p-type semiconductor layer 260 may be doped with Zn or Mg.

The active layer 240 is a region in which electrons and holes are recombined and may include InGaN. The wavelength of extracted light depends upon the material of the active layer 240. The active layer 240 may be a multi-layered film having quantum well layers and barrier layers repeatedly formed. The barrier well layer and quantum well layer may be binary or quaternary compound semiconductor layers represented by a general formula of Al$_x$In$_y$Ga$_{1-x-y}$N ($0 \leq x, y, x+y \leq 1$).

According to an embodiment of the present invention, a tunnel layer 310 is arranged between the transparent electrode layer 320 and the p-type semiconductor layer 260. The tunnel layer 310 allows an ohmic contact to form between the transparent electrode layer 320 and the p-type semiconductor layer 260. The tunnel layer 310 includes an n++ tunnel layer doped with a highly concentrated n-type impurity. In an embodiment of the present invention, n++ In$_{1-x}$Al$_{1-y}$Ga$_{1-z}$N ($0 \leq x \leq 1, 0 \leq y \leq 1, 0 \leq z \leq 1$) is used as a material of the tunnel layer 310.

In addition, an opening 342 that exposes a portion of the tunnel layer 310 upward is arranged in the transparent electrode layer 320. The opening 342 may be formed by etching a portion of the transparent electrode layer 320. A portion of the transparent electrode layer 320 that is not to be etched is covered with a mask material such as photoresist (PR), and then an etching process is performed to remove the portion of the transparent electrode layer 320 corresponding to the opening 342. The etching process may be a wet or dry etching process. According to an embodiment of the present invention, a portion of the tunnel layer 310 is exposed by the opening 342. However, since the opening 342 is formed through the etching process, the p-type semiconductor layer 260 under the tunnel layer 310 may be exposed upward by the opening 342.

A DRB 330 may be arranged to a predetermined height in the opening 342. The DBR 330 may be formed by filling the opening 342 so that the DBR 330 has the predetermined height measured from an upper surface of the tunnel layer 310. A lower surface of the DBR 330 may contact the upper surface of the tunnel layer 310, and an upper surface of the DBR 330 may contact the p-type electrode pad 340 arranged on the transparent electrode layer 320. The p-type electrode pad 340 may be formed of a metallic material, such as Ni, Cr, Pt, Au, Ag, Ti or W, or a carbon nano tube.

A lower surface of the p-type electrode pad 340 may contact the upper surface of the DBR 330 in the opening 342, and a side surface of the p-type electrode pad 340 may contact the transparent electrode layer 320 in the opening 342. Furthermore, the p-type electrode pad 340 may contact the transparent electrode layer 320 outside of the opening 342, such as along an upper surface of the transparent electrode layer 320 as shown.

The DBR 330 blocks current from directly flowing from the p-type electrode pad 340 to the tunnel layer 310, so that the current can be more widely spread in the transparent electrode layer 320. Further, the DBR 330 structure has a light reflectance much greater than that of a metal of the p-type electrode pad 340, thereby reducing light absorption by the p-type electrode pad 340 and light loss. An LED provided with a current spreading function under the p-type electrode pad 340 has been disclosed in Korean Patent No. 10-0721515, which is registered in the name of the applicant and incorporated herein by reference as a part of this specification.

Where $\lambda$ is a wavelength of light, n is a refractive index of a medium, and m is an odd number, the DBR 330 may have a structure in which semiconductor layers are alternately laminated to a thickness of $m\lambda/4n$ to obtain a reflectance of 95% or more in light having a specific wavelength ($\lambda$). The DBR 330 has bandgap energy greater than an oscillation wavelength, and therefore, light is not well absorbed thereto. The refractive index between the layers (i.e., media) of the DBR 330 is increased, whereby the reflectance can be more increased.

Referring to FIG. 2, the DBR 330 has a structure in which low refractive index layers 330a and high refractive index layers 330b are repeatedly laminated. The low refractive index layers 330a and high refractive index layers 330b have a $\lambda/4$ thickness of a reference wavelength. Although a variety of materials may be considered as the materials of the low refractive index layers 330a and the high refractive index layers 330b, SiO$_2$ having a refractive index of 1.4 or Al$_2$O$_3$ having a refractive index of 1.6 may be used as the low refractive index layer 330a, while Si$_3$N$_4$ or TiO$_2$ having a refractive index of over 2 or Si—H having a refractive index of over 3 may be used as the high refractive index layer 330b.

Figure 3:
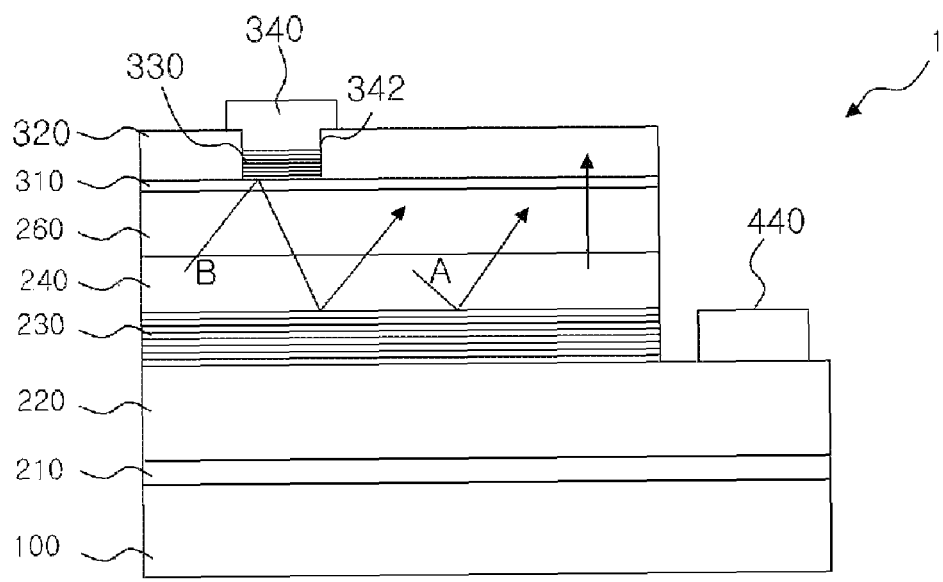
FIG. 3 is a sectional view of an LED according to another embodiment of the present invention.

FIG. 3 is a sectional view of an LED according to another embodiment of the present invention. Referring to FIG. 3, an LED 1 of this embodiment includes a DBR 330 (hereinafter, referred to as an "upper DBR") arranged in an opening 342 between a p-type electrode pad 340 and a tunnel layer 310, and further includes a DBR 230 (hereinafter, referred to as a "lower DBR") arranged under an active layer 240. The configuration of the lower DBR 230 is the same as or substantially similar to that of the upper DBR 330 described with reference to FIG. 2. Therefore, detailed description of the configuration will be omitted.

In the LED 1 shown in FIG. 3, light generated from the active layer 240, which is designated by arrow A, and light reflected by the upper DBR 330, which is designated by arrow B, are reflected upward by the lower DBR 230. Thus, light extraction efficiency of the LED is enhanced by a high reflectance of the lower DBR 230. Further, a moving distance of light can be shortened in the LED as compared with the conventional LED in which light is reflected by a reflective material arranged under a substrate. Accordingly, light extraction efficiency of the LED can also be enhanced.

Figure 4:
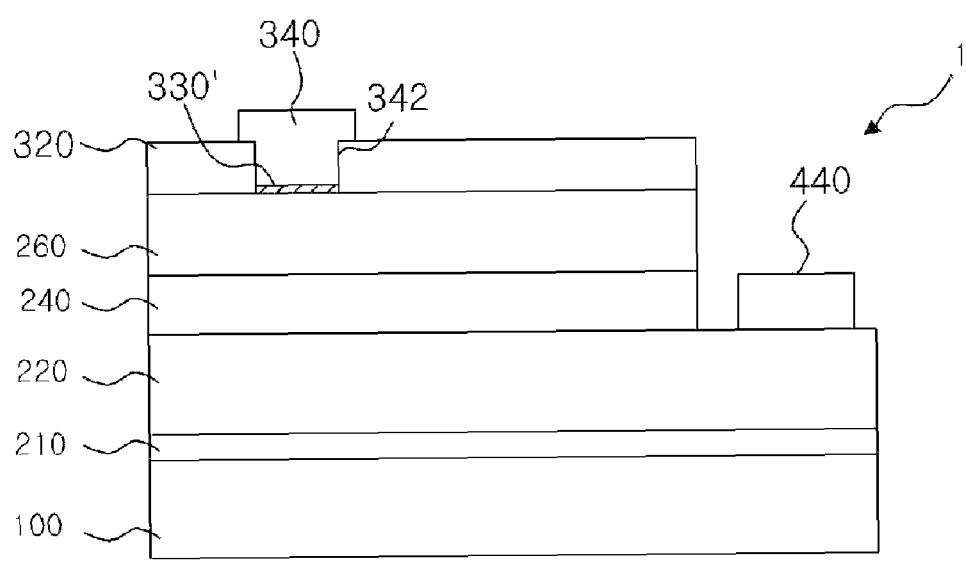
FIG. 4 is a sectional view of an LED according to another embodiment of the present invention.

FIG. 4 is a sectional view of an LED 1 according to other embodiment of the present invention. In the LED 1 of this embodiment, an opening 342 is arranged in the transparent electrode layer 320, and a p-type electrode pad 340 is arranged in the opening 342, wherein a lower surface of the p-type electrode pad 340 contacts a layer 330', which is arranged on the p-type semiconductor layer 260 and is in ohmic contact with the electrode pad 340. The layer 330' may be an n++ layer doped with a high concentrated n-type impurity or an undoped InGaN. Thus, the DBR 330 positioned in the opening 342 as described in the previous embodiments may be omitted.

According to the exemplary embodiments of the present invention, a DBR reflects light advancing toward an electrode pad with high reflection efficiency, whereby light loss caused by light absorption by the electrode pad can be reduced. Therefore, light extraction efficiency can be enhanced. Further, the exemplary embodiments of the present invention prevent current from directly flowing from the electrode pad to a p-type semiconductor layer or a tunnel layer arranged thereon, thereby enhancing current spreading efficiency in a transparent electrode layer, and therefore, luminous efficiency of an LED.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED), comprising:
   an n-type semiconductor layer, an active layer, a p-type semiconductor layer, and a transparent electrode layer arranged on a substrate;
   a tunnel layer interposed between the p-type semiconductor layer and the transparent electrode layer;
   an opening arranged in the transparent electrode layer so that the tunnel layer or the p-type semiconductor layer under the tunnel layer is exposed upward;
   a distributed Bragg reflector (DBR) arranged in the opening; and
   an electrode pad arranged on the transparent electrode layer to cover the DBR in the opening.

2. The LED of claim 1, wherein a side surface of the electrode pad contacts an inner side surface of the opening, and a lower surface of the electrode pad contacts the DBR.

3. The LED of claim 1, wherein the tunnel layer is an n-type tunnel layer (n++) doped with a highly concentrated n-type impurity.

4. The LED of claim 1, wherein the transparent electrode layer is an indium tin oxide (ITO) layer.

5. The LED of claim 1, further comprising a lower DBR arranged under the active layer.

6. The LED of claim 1, wherein the LED is a GaN-based LED.

7. The LED of claim 1, wherein the DBR comprises low refractive index layers and high refractive index layers alternately laminated.

8. The LED of claim 7, wherein the low refractive index layers comprise $SiO_2$ or $Al_2O_3$.

9. The LED of claim 7, wherein the high refractive index layers comprise $Si_3N_4$, $TiO_2$, or Si—H.

10. A light emitting diode (LED), comprising:
    an n-type semiconductor layer, an active layer, a p-type semiconductor layer, and a transparent electrode layer arranged on a substrate;
    an opening arranged in the transparent electrode layer;
    an electrode pad arranged to partially fill the opening; and
    an n++ or undoped layer arranged on the transparent electrode layer and contacting the electrode pad.

* * * * *